United States Patent
Goto et al.

(10) Patent No.: US 6,500,356 B2
(45) Date of Patent: Dec. 31, 2002

(54) SELECTIVELY ETCHING SILICON USING FLUORINE WITHOUT PLASMA

(75) Inventors: Haruhiro Harry Goto, Saratoga, CA (US); William R. Harshbarger, San Jose, CA (US); Kam S. Law, Union City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/535,420

(22) Filed: Mar. 27, 2000

(65) Prior Publication Data

US 2002/0134755 A1 Sep. 26, 2002

(51) Int. Cl.$^7$ ............................................. H01L 21/00
(52) U.S. Cl. ........................ 216/72; 216/79; 438/715; 438/719; 438/738
(58) Field of Search ............................ 216/58, 72, 79; 438/706, 715, 719, 735, 737, 738, 743, 744

(56) References Cited

U.S. PATENT DOCUMENTS

| | | | | |
|---|---|---|---|---|
| 4,498,953 A | * | 2/1985 | Cook et al. ................. | 156/646 |
| 4,786,361 A | * | 11/1988 | Sekine et al. ............... | 156/643 |
| 4,854,263 A | * | 8/1989 | Chang et al. ............... | 118/715 |
| 5,000,113 A | * | 3/1991 | Wang et al. ................ | 118/723 |
| 5,129,958 A | | 7/1992 | Nagashima et al. | |
| 5,180,466 A | * | 1/1993 | Shin .......................... | 156/643 |
| 5,302,236 A | * | 4/1994 | Tahara et al. ............... | 156/643 |
| 5,366,585 A | * | 11/1994 | Robertson et al. .......... | 156/643 |
| 5,425,842 A | | 6/1995 | Zijlstra | |
| 5,534,107 A | * | 7/1996 | Gray et al. .............. | 156/643.1 |
| 5,620,526 A | | 4/1997 | Watatani et al. | |
| 5,726,480 A | * | 3/1998 | Pister ......................... | 257/415 |
| 5,756,400 A | | 5/1998 | Ye et al. | |
| 5,770,098 A | * | 6/1998 | Araki et al. ................. | 216/67 |
| 5,830,807 A | * | 11/1998 | Matsunaga et al. ......... | 438/714 |
| 5,844,205 A | * | 12/1998 | White et al. ................ | 219/390 |
| 5,922,219 A | * | 7/1999 | Fayfield et al. ............. | 216/58 |
| 5,958,801 A | * | 9/1999 | Langley ...................... | 438/738 |
| 6,117,793 A | * | 9/2000 | Tang .......................... | 438/740 |

OTHER PUBLICATIONS

Flamm, J. et al., "XeF2 and F–Atom Reactions with Si: Their Significance for Plasma Etching, Solid State Technology," Apr. 1983, pp. 117–121.*

Ibbotson, D.E. et al., "Plasmaless Dry Etching of Silicon with Fluorine–Containing Compounds," Jun. 6, 1984.*

Ibbotson, D.E. et al., Comparison of XeF2 and F–Atom Reactions with Si and SiO2, Mar. 28, 1984.*

Aliev, V.S. et al., "Development of Si(100) Surface Roughness at the Initial Stage of Etching in F2 and XeF2 Gases: Ellipsometric Study," Surface Science, pp. 206–214 (1999).*

Wang, X. et al., "Gas–Phase Silicon Etching with Bromine Trifluoride," Transducers, 1997 International Conference on Solid–State Sensors and Actuators (1997).*

Streller, U. et al., "Selectivity in Dry Etching of Si(100) with XeF2 and VUV Light," Applied Surface Science, pp. 341–346 (1996).*

Habuka, H. et al., "Dominant Overall Chemical Reaction in a Chlorine Trifluoride–Silicon–Nitrogen System at Atmospheric Pressure," Jpn. J. Appl. Phys., vol. 38 pp. 6466–6469 (1999).*

Flamm et al., "Reaction of fluorine atoms with SiO$_2$," J. Appl. Phys., 50 (10), pp. 6211–6213, American Institute of Physics (Oct. 1979).

Donnelly et al., "Studies of chemiluminescence accompanying fluorine atom etching of silicon," J. Appl. Phys., 51 (10), pp. 5273–5276, American Institute of Physics (Oct. 1980).

Flamm et al., "The reaction of fluorine atoms with silicon," J. Appl. Phys., 52 (5), pp. 3633–3639, American Institute of Physics (May 1981).

Mucha et al., "Chemiluminescence and the reaction of molecular fluorine with silicon," J. Phys. Chem., vol. 85, pp. 3529–3532, American Chemical Society (1981).

Mucha et al., "Chemiluminescent reaction of SiF$_2$ with fluorine and the etching of silicon by atomic and molecular fluorine," 53 (6), pp. 4553–4554, American Institute of Physics (Jun. 1982).

Flamm et al., "XeF$_2$ and F–atom reactions with Si: their signifance for plasma etching," Solid State Technology, Apr. 1993, pp. 117–121.

* cited by examiner

*Primary Examiner*—Randy Gulakowski
*Assistant Examiner*—J Smetana
(74) *Attorney, Agent, or Firm*—Robert J. Stern

(57) ABSTRACT

A process for selectively etching silicon from a workpiece without etching silicon oxide or silicon nitride. The principal etchant gas is molecular fluorine gas ($F_2$) that is not excited to a plasma state.

10 Claims, No Drawings

SELECTIVELY ETCHING SILICON USING FLUORINE WITHOUT PLASMA

FIELD OF THE INVENTION

The invention relates to processes for etching a silicon film on a workpiece. More specifically, the invention relates to processes for selectively etching silicon without etching silicon oxide or silicon nitride.

BACKGROUND OF THE INVENTION

Electronic devices containing silicon-based semiconductors, such as integrated circuits and flat panel displays, generally are fabricated by depositing many successive layers of silicon, metal and dielectric and patterning the layers to form various electronic circuitry components such as transistors, resistors, capacitor, and interconnect conductors.

The most commonly used dielectric materials are silicon oxide and silicon nitride. Silicon layers can function as semiconductors or conductors depending on their level of impurity doping.

To form the desired electronic component structures, it is necessary to etch a pattern in one layer of material without etching adjacent layers. However, most etch processes intended to selectively etch one specific material, such as silicon, unavoidably etch to some extent layers of other materials, such as silicon oxide or silicon nitride, that are adjacent to or underlying the layer that is intended to be etched.

Selective etch processes can be characterized by a selectivity ratio, which is the ratio between the amount of desired material removed to the amount of undesired material removed by the etch process per unit time. An etch process generally will have different selectivity ratios relative to different undesired materials. High selectivity is very difficult to achieve.

Therefore, a need exists for a process for selectively etching silicon without etching silicon oxide or silicon nitride.

SUMMARY OF THE INVENTION

The invention is a process for selectively etching silicon without etching silicon oxide or silicon nitride. The principal etchant gas is molecular fluorine gas ($F_2$) that is not excited to a plasma state.

I discovered that, when not decomposed in a plasma, molecular fluorine gas effectively etches silicon without etching silicon oxide or silicon nitride to any measurable extent. Therefore, a silicon etch process using molecular fluorine can achieve essentially infinite etch selectivity relative to silicon oxide and silicon nitride.

DETAILED DESCRIPTION OF THE PREFERRED EMBODIMENTS

I tested the selectivity with which molecular fluorine would etch silicon without etching silicon oxide or silicon nitride. Instead of performing such tests using a substrate having multiple layers of silicon and dielectric, I attempted to etch three separate substrates on which these three respective films had been deposited.

Specifically, three 80×80 mm glass substrates were prepared by depositing three different films on the three substrates, namely, amorphous silicon, silicon oxide, and silicon nitride, respectively. The three substrates then were mounted on a susceptor within a conventional vacuum chamber. The susceptor was heated to 450° C. The substrate temperature was estimated to be about 65 degrees cooler than the susceptor, i.e., about 385° C. Molecular fluorine ($F_2$) gas was supplied to the chamber at a flow rate of 1000 sccm while an exhaust pump reduced the chamber pressure to about 260 millitorr (mT).

The result of this test was that the amorphous silicon was etched at a rate of 5000 Å/min. However, no etching of the silicon nitride or silicon oxide could be detected. Therefore, this etch process using molecular fluorine in the absence of a plasma demonstrated effective etching of silicon with essentially infinite selectivity against etching of silicon oxide and silicon nitride.

Other tests demonstrated the importance of not exciting the molecular fluorine to a plasma state. Plasma excitation was found to decompose a portion of the molecular fluorine into atomic fluorine that did etch the silicon oxide and silicon nitride dielectric materials, thereby making the etch process non-selective against these dielectric materials.

Although the silicon etch process was tested only at a substrate temperature of about 385° C. (a susceptor temperature of 450° C.), the temperature need not be that high. It is a matter of routine experimentation to determine the minimum temperature to which a substrate or workpiece must be elevated in order to cause the molecular fluorine gas to react with and remove a silicon layer exposed on the substrate.

Although the silicon etch process was tested with a reagent consisting of essentially 100% pure molecular fluorine gas, the process should perform similarly if the fluorine gas is mixed with a carrier gas. The carrier gas may be a mixture of one or more nonreactive gases, or it may be include any gases that are, in the absence of a plasma, nonreactive with the material (e.g., silicon oxide or silicon nitride) other than silicon against which the silicon etch process is desired to be selective.

Although the silicon etch process was tested only at a chamber pressure of 260 millitorr, the process is expected to also perform well at much higher chamber pressures, including atmospheric pressure (760 torr).

Even if the process is performed at atmospheric pressure, it is desirable to perform it within a sealed chamber such as a conventional vacuum chamber in order to protect the substrate or workpiece from contamination by substances in the ambient atmosphere. For example, it is important to exclude atmospheric hydrogen and water vapor from the chamber, because these substances would react with the fluorine reagent to produce hydrofluoric acid (HF), which is extremely corrosive and potentially hazardous. As another example, it may be important to exclude atmospheric oxygen and nitrogen from the chamber, because these substances may react to some extent with the silicon layer to be etched so as to form silicon oxide or silicon nitride that cannot be etched by the molecular fluorine.

Any type of sealed chamber or vacuum chamber should be suitable for performing the silicon etch process of the invention. The primary requirements are that the chamber components not release any substances that would contaminate the substrate or workpiece being etched, and that any chamber components in thermal contact with the substrate be capable of withstanding the temperature to which the substrate is heated. The vacuum chamber used in the test of the invention described above was a conventional, commercially available semiconductor fabrication process chamber intended primarily for performing etching and chemical vapor deposition (CVD) processes on large substrates or workpieces, especially the glass substrates used for fabricating thin film transistor (TFT) flat panel displays.

The design and operation of conventional vacuum chambers for semiconductor processing are described in the following commonly-assigned U.S. patents, the entire content of each of which is hereby incorporated by reference in this patent specification: U.S. Pat. No. 4,854,263 issued Aug. 8, 1989 to Chang et al.; U.S. Pat. No. 5,000,113 issued Mar. 19, 1991 to Wang et al.; U.S. Pat. No. 5,366,585 issued Nov. 22, 1994 to Robertson et al.; and U.S. Pat. No. 5,844,205 issued Dec. 1, 1998 to White et al.

What is claimed is:

1. A process for selectively etching silicon from a workpiece without etching silicon oxide or silicon nitride, comprising the simultaneous steps of:

holding the workpiece within a chamber interior; and supplying to the chamber interior a gas mixture including one or more gases while sealing the chamber interior to prevent any gas other than said gas mixture from entering the chamber interior, wherein said one or more gases includes molecular fluorine, the supplying step includes supplying said molecular fluorine to the chamber interior at a flow rate of at least 1000 sccm, and the molecular fluorine is not excited to a plasma state.

2. A process according to claim 1, further comprising the step of:

heating the workpiece sufficiently for the molecular fluorine to react with any exposed silicon on the workpiece.

3. A process according to claim 1, further comprising the steps of:

before the step of supplying the gas mixture, depositing silicon on the workpiece; and during the step of supplying the gas mixture, elevating the temperature of the workpiece sufficiently for the molecular fluorine to react with the silicon.

4. A process according to claim 1, wherein the gas mixture consists essentially of molecular fluorine.

5. A process according to claim 1, wherein the gas mixture includes no substantial amount of any reactive gas other than molecular fluorine.

6. A process according to claim 1, wherein the gas mixture includes no substantial amount of any substance that reacts with silicon oxide in the absence of a plasma.

7. A process according to claim 1, wherein the gas mixture includes no substantial amount of any substance that reacts with silicon nitride in the absence of a plasma.

8. A process according to claim 1, wherein said flow rate substantially equals 1000 sccm.

9. A process according to claim 1, further comprising the simultaneous step of:

heating the workpiece to a temperature of at least 385° C.

10. A process for selectively etching silicon from a workpiece without etching silicon oxide or silicon nitride, comprising the simultaneous steps of:

holding the workpiece within a chamber interior;

heating the workpiece to a temperature of about 385° C.; and supplying to the chamber interior a gas mixture including one or more gases while sealing the chamber interior to prevent any gas other than said gas mixture from entering the chamber interior;

wherein said one or more gases includes molecular fluorine;

wherein the supplying step includes supplying said molecular fluorine to the chamber interior at a flow rate of about 1000 sccm; and wherein the molecular fluorine is not excited to a plasma state.

* * * * *